(12) United States Patent
Mori

(10) Patent No.: US 6,489,657 B1
(45) Date of Patent: Dec. 3, 2002

(54) SEMICONDUCTOR DEVICE WITH IMPROVED CHANNEL STOPPER

(75) Inventor: Hideki Mori, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/664,272

(22) Filed: Sep. 18, 2000

(30) Foreign Application Priority Data

Sep. 17, 1999 (JP) ............................................. 11-264503
Oct. 27, 1999 (JP) ............................................. 11-305477
Aug. 18, 2000 (JP) ......................................... 2000-248870

(51) Int. Cl.$^7$ ............................................. H01L 29/76
(52) U.S. Cl. ...................... 257/399; 257/394; 257/401; 438/298
(58) Field of Search ................................. 257/335, 339, 257/344, 372, 376, 394, 399, 404, 493, 401; 436/298

(56) References Cited

U.S. PATENT DOCUMENTS 5,357,137 A * 10/1994 Hayama ...................... 257/396
6,232,642 B1 * 5/2001 Yamazaki ................... 257/404

FOREIGN PATENT DOCUMENTS

JP  4-02-105579  * 4/1990 ................. 257/205
JP  4-02-226758  * 9/1990 ................. 257/394

* cited by examiner

Primary Examiner—George C. Eckert, II
(74) Attorney, Agent, or Firm—Sonnenschein, Nath & Rosenthal

(57) ABSTRACT

A semiconductor device comprising a high withstand voltage MOS transistor of an offset drain/offset source structure easing a high electric field generated between a channel and a parasitic channel stopper in an operating state and preventing changes of a threshold voltage $V^{th}$, on-resistance $R_{on}$, or other characteristics, said device characterized in that a parasitic channel stopper layer containing an impurity is formed with a concentration gradient wherein the impurity concentration decreases along with approaching a channel region and a method of producing the same.

15 Claims, 13 Drawing Sheets

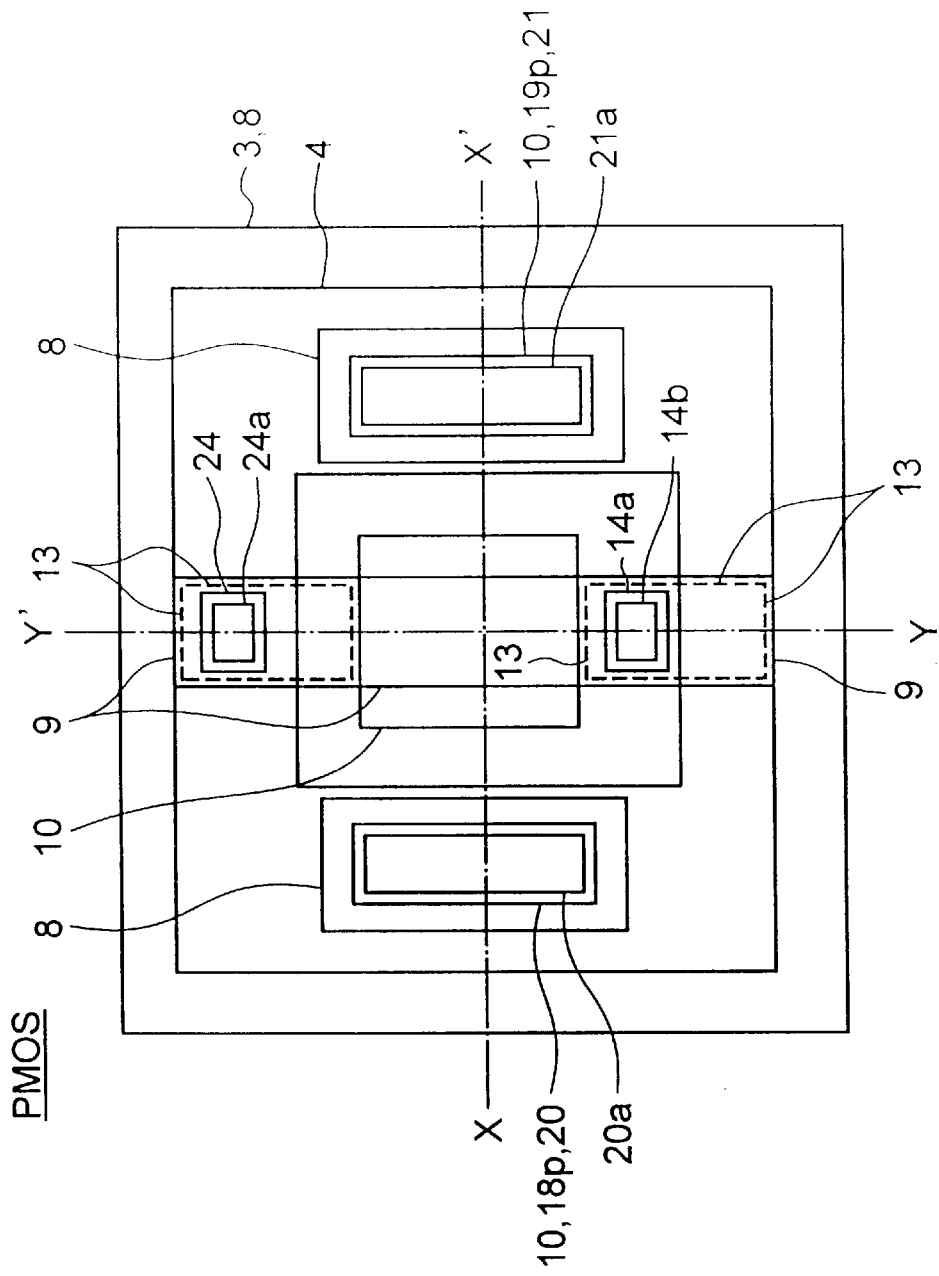

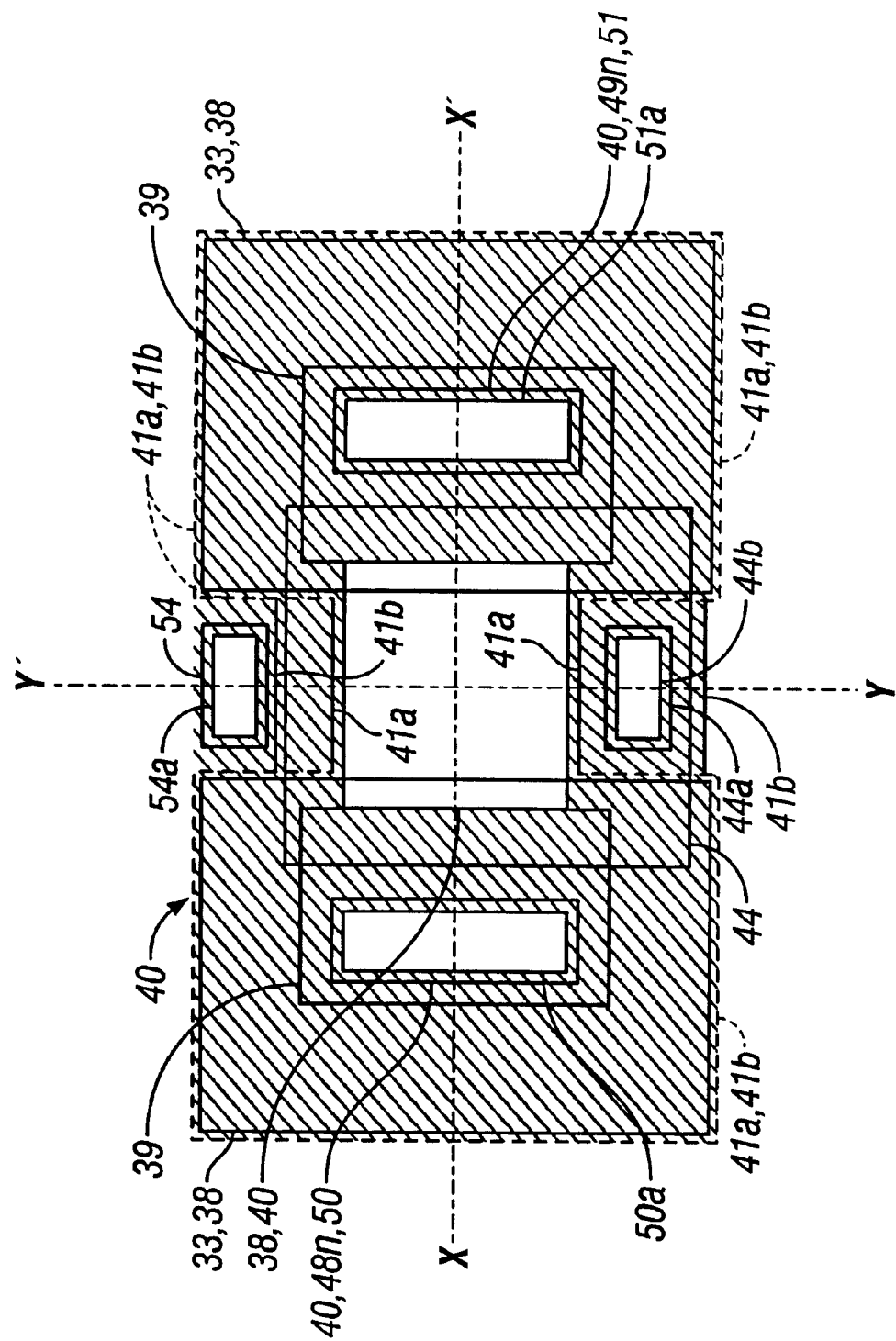

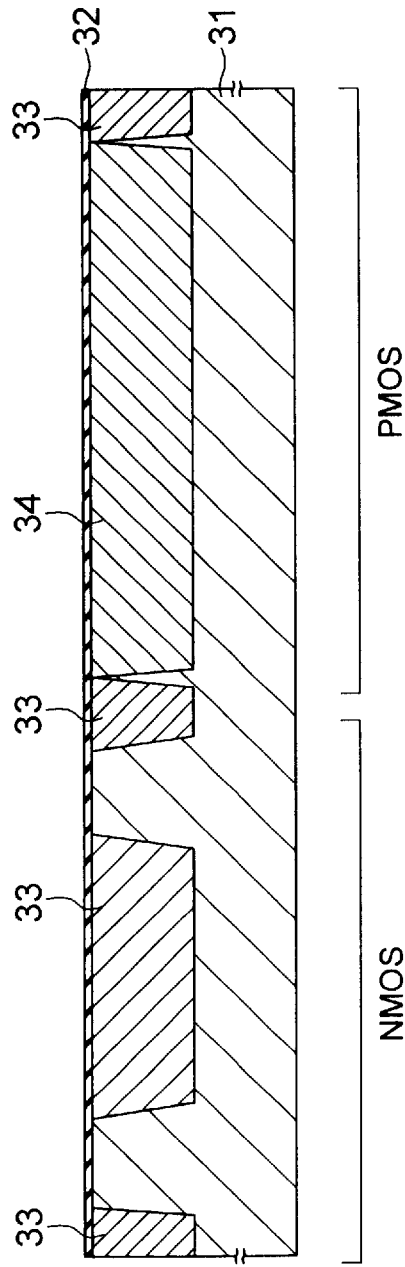
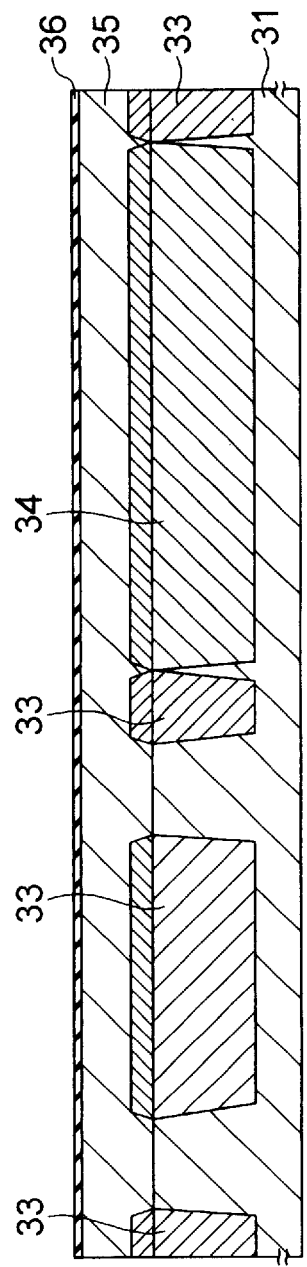
FIG. 11A
FIG. 11B

SEMICONDUCTOR DEVICE WITH IMPROVED CHANNEL STOPPER

BACKGROUND OF THE INVENTION

1. Field of the Invention

The present invention relates to a semiconductor device comprising a high withstand or threshold voltage MOS (metal oxide semiconductor) transistor and a method of producing the same.

More particularly, the present invention relates to a semiconductor device comprising a high withstand voltage MOS transistor having an offset drain/offset source structure that includes a channel region and a parasitic channel stopper layer formed below a field insulating film that abuts the channel region. The channel stopper layer has an impurity concentration gradient that decreases in the direction of the channel region, to substantially prevent a high electric field from being generated between the channel region and the parasitic channel stopper when the transistor is in an operational state.

2. Description of the Related Art

Along with the increase in size of displays of personal computers and television sets for home use, the market for displays has expanded rapidly. Also, in the current field of displays, while CRTs having a high definition, a high luminance, a wide viewing angle, a high contrast, and other superior view ability are most widespread, attention is focusing on the increase in the space they occupy along with their future enlargement. In addition to liquid crystal displays and projector displays, plasma displays of a new type using plasma and other flat panel displays capable of being made thinner have been looked to as the next-generation of displays to take the place of CRTs. In view of this situation, in the field of semiconductor devices, a high withstand voltage process able to form a driver IC of a high withstand voltage of several hundred volts for controlling plasma has been required.

For facilitating understanding of the present invention, a conventional high withstand voltage NMOS transistor and high withstand voltage PMOS transistor will be explained with reference to the drawings.

FIG. 1 is a top view of a conventional high withstand voltage NMOS transistor viewed from an upper side of the substrate. FIG. 2A is a cross-sectional view along X–X' of FIG. 1. FIG. 2B is a cross-sectional view along Y–Y' of FIG. 1. FIG. 3 is a top view of a conventional high withstand voltage PMOS transistor viewed from an upper side of the substrate. FIG. 4A is a cross-sectional view along X–X' of FIG. 3. FIG. 4B is a cross-sectional view along Y–Y' of FIG. 3. In the top views of FIG. 1 and FIG. 3, a broken line represents a part that is overlapped with another part represented by a solid line.

These high withstand voltage MOS transistors are called LOD/S (LOCOS offset drain/source)-type LDMOS transistors. The structure of the NMOS transistor shown in FIGS. 1, 2A and 2B will now be explained. A buried layer doped with a p-type impurity (PBL) 3 is formed in a predetermined region of a p-type silicon semiconductor substrate 1 on which an n-type epitaxial layer 5 is then formed. A p-well 8 and n-wells 9 are formed in a surface part of the n-type epitaxial layer 5.

Also, on the p-well 8 of a region separated by a field insulating film, that is, LOCOS oxide film 10, a gate electrode 14 is formed with side wall protection oxide films 17 adjacent a gate oxide film 12. On the gate electrode 14, as shown in FIG. 2B, a gate electrode plug 14a is formed. On the surface of the n-wells 9 separated from each other by the p-well 8, an n-type source region 18n and an n-type drain region 19n are formed. These are connected to a source electrode 20 and a drain electrode 21 respectively.

As shown in FIG. 2B, an n-channel formation region 22 is formed on a surface of the p-well 8 just below the polycrystalline silicon gate electrode 14. When voltage is supplied on the gate electrode 14, a channel is formed in the n-channel region 22. Also, at parts of the p-well 8 contacting the LOCOS oxide film 10, parasitic n-channel stopper layers 11 containing a p-type impurity are formed so as to sandwich this n-channel formation region 22 between them. Due to this, the withstand voltage is increased.

Further, as shown in FIGS. 2A and 2B, in the above transistor, silicon oxide films 15, 16 covering the upper side are formed.

The PMOS transistor shown in FIG. 3 and FIGS. 4A and 4B has a similar structure. An n-well 9 is formed on a n-type buried layer 4 formed on the substrate 1. Also, on the surface of the p-well 8 separated by the n-well 9, a p-type source region 18p and a p-type drain region 19p are formed. A p-channel formation region 23 is formed on a surface of the n-well 9 just below the polycrystalline silicon gate electrode 14. Also, at parts of the n-well 9 contacting the LOCOS oxide film 10, parasitic p-channel stopper layers 13 containing an n-type impurity are formed so as to sandwich the p-channel formation region 23 between them. Due to this, the withstand voltage is increased.

These high withstand voltage NMOS and PMOS transistors are called LOD/S (LOCOS offset drain/source)-type LDMOS transistors. In these MOS transistors, for the purpose of securing a high BVds Ounction withstand voltage between source and drain), for example in the case of the NMOS, as shown in FIG. 2A, the n-type source region 18 and n-type drain region 19 are formed away from the p-well 8 by the LOCOS oxide film 10.

In this MOS transistor, when a reverse bias is supplied between the source and the drain, a depletion layer extends from a junction of the p-well 8 of a low concentration of impurity and the n-well 9 to the n-well 9. The withstand voltage is secured by using the extension of the depletion layer to the n-well 9 for easing the electric field.

In addition, in this transistor, the withstand voltage is increased further by employing a RESURF (reduced surface field) technique, that is, easing of the electric field at the surface of the n-well 9 using an extension of a depletion layer at the junction of the p-type silicon semiconductor substrate 1 of a low concentration of impurity and the n-type epitaxial layer 5 of a low concentration of impurity in the surface direction.

Also, unlike general LOD-type LDMOS transistors, since these MOS transistors have a symmetrical structure right and left from the gate, that is, in the direction of the source and the drain, it is possible to obtain a high withstand voltage not only between a backgate connected generally to a reference voltage and the drain and between the gate and the drain or other drain sides but also between a backgate and the source and between the gate and source or other source sides.

However, when the NMOS transistor shown in FIG. 2 is in an on state, that is, in the state where the source electrode 20 and drain electrode 21 have any voltage, a positive voltage is supplied on the polycrystalline silicon gate electrode 14, a channel is formed in the n-channel formation region 22 as shown in FIG. 2B, and an electric current flows between the source and drain. When the source electrode 20 (or the drain electrode) voltage becomes a high voltage, a high electric field is generated at the junction of the n-channel region 22 and the parasitic n-channel stopper layer 11 (parts shown with arrows) and a junction breakdown is sometimes caused.

Further, it suffers from the disadvantage that carriers generated by this breakdown jump into the gate oxide film 12 due to the positive voltage supplied on the polycrystalline silicon gate electrode 14, causing the threshold voltage $V_{th}$ to change.

Also, in the PMOS transistor too, as shown in FIG. 4B, when the voltage of the source electrode 20 becomes a high voltage, a high electric field is generated at the junction of the p-channel 23 and the parasitic p-channel stopper layer 13 (parts shown with arrows) and a breakdown is induced in the same manner. Then, it suffers from the disadvantage that carriers generated by this change the threshold voltage $V_{th}$.

If an analog switch comprised of high withstand voltage NMOS and PMOS transistors as shown in FIG. 5 is formed, an input signal can no longer be transferred accurately to an output circuit, when changes in the threshold voltage $V_{th}$ are induced as described above. This greatly influences the characteristics of the IC. Therefore, in the prior art, it was necessary to restrict the voltage of the input signal able to prevent fluctuation in or a change to the threshold voltage of $V_{th}$ for the respective NMOS or PMOS transistor.

SUMMARY OF THE INVENTION

An object of the present invention is to provide a semiconductor device comprising a high withstand voltage MOS transistor having an offset drain/offset source structure wherein the high electric field generated between the channel and the parasitic channel stopper in an operating state is eased and changes to the threshold voltage $V_{th}$, on-resistance $R_{on}$, or other characteristics are prevented.

Another object of the present invention is to provide a method of producing the semiconductor device in a high yield.

According to the first aspect of the present invention, there is provided a semiconductor device comprising: a substrate; an epitaxial layer formed on the substrate; a source region and a drain region formed in the epitaxial layer and containing a first conductivity type impurity; a source electrode connected to the source region; a drain electrode connected to the drain region; a channel region formed between the source region and drain region; a gate insulating film formed on the channel region; and a gate electrode formed on the gate insulating film, said device comprising at least a second conductivity type channel stopper layer formed in proximity to the channel region in the epitaxial layer except between the source region and/or drain region and the gate electrode, wherein an impurity concentration in a first region of the channel stopper layer near the channel region is lower than an impurity concentration in a second region far from the channel region.

Preferably, the semiconductor device further comprises a field insulating film formed on the channel stopper layer.

Preferably, the semiconductor device further comprises a field insulating film formed on a surface of the epitaxial layer between the source electrode and/or the drain electrode and the gate electrode.

Preferably, the semiconductor device further comprises said field insulating film formed on a surface of the epitaxial layer between the source electrode and/or the drain electrode and the gate electrode.

Preferably, the field insulating film is an oxide film.

According to the second aspect of the present invention, there is provided a semiconductor device comprising: a first conductivity type substrate; a second conductivity type epitaxial layer formed on the substrate; a first well region and a second well region formed in the epitaxial layer and containing a second conductivity type impurity; a source region formed in the first well region and containing a second conductivity type impurity at a higher concentration than the first well region; a drain region formed in the second well region and containing a second conductivity type impurity at a higher concentration than the second well region; a source electrode connected to the source region; a drain electrode connected to the drain region; a channel region formed between the source region and the drain region; a gate insulating film formed on the channel region; and a gate electrode formed on the gate insulating film, wherein the channel region is included in at least a first conductivity type third well, said device comprising at least a first conductivity type channel stopper layer formed in proximity to the channel region in the epitaxial layer except between the source region and/or the drain region and the gate electrode, wherein an impurity concentration in a first region of the channel stopper layer near the channel region is lower than an impurity concentration in a second region far from the channel region.

Preferably, the semiconductor device further comprises a field insulating film formed on the channel stopper layer.

Preferably, the semiconductor device further comprises a field insulating film formed on a surface of the epitaxial layer between the source electrode and/or the drain electrode and the gate electrode.

Preferably, the semiconductor device further comprises the field insulating film formed on a surface of the epitaxial layer between the source electrode and/or the drain electrode and the gate electrode.

Preferably, the field insulating film is an oxide film.

According to the third aspect of the present invention, there is provided a semiconductor device comprising: a first conductivity type substrate; a second conductivity type buried layer formed in the substrate; a second conductivity type epitaxial layer formed on the substrate; a first well region and a second well region formed in the epitaxial layer and containing a first conductivity type impurity; a source region formed in the first well region and containing a first conductivity type impurity at a higher concentration than the first well region; a drain region formed in the second well region and containing a first conductivity type impurity at a higher concentration than the second well region; a source electrode connected to the source region; a drain electrode connected to the drain region; a channel region formed between the source region and the drain region; a gate insulating film formed on the channel region; and a gate electrode formed on the gate insulating film, wherein the channel region is included in at least a second conductivity type third well, said device comprising at least a second conductivity type channel stopper layer formed in proximity to the channel region in the epitaxial layer except between the source region and/or the drain region and the gate electrode, wherein an impurity concentration in a first region of the channel stopper layer near the channel region is lower than an impurity concentration in a second region far from the channel region.

Preferably, the semiconductor device further comprises a field insulating film formed on the channel stopper layer.

Preferably, the semiconductor device further comprises a field insulating film formed on a surface of the epitaxial layer between the source electrode and/or the drain electrode and the gate electrode.

Preferably, the semiconductor device further comprises the field insulating film formed on a surface of the epitaxial layer between the source electrode and/or the drain electrode and the gate electrode.

Preferably, the field insulating film is an oxide film.

Due to this, it is possible to ease the high electric field generated between the channel and parasitic channel stopper in an operating state and reliably prevent a change to the threshold voltage $V_{th}$, on-resistance $R_{on}$, or other characteristics.

According to the fourth aspect of the present invention, there is provided a method of producing a semiconductor device for forming a PMOS transistor and an NMOS transistor on a same substrate, said method comprising the steps of: introducing a first conductivity type impurity in the NMOS transistor formation region and introducing a second conductivity type impurity in the PMOS transistor formation region; forming a second conductivity type epitaxial layer on the substrate; forming a first conductivity type first well region in the epitaxial layer of the NMOS transistor formation region and forming first conductivity type second and third well regions in the epitaxial layer of the PMOS transistor formation region; forming second conductivity type fourth and fifth well regions at both edges of the first well region and forming a second conductivity type sixth well region between the second well region and the third well region; forming a first channel stopper layer by introducing a second conductivity type impurity in the epitaxial layer except a direction facing the second well region and/or the third well region and the sixth well region; forming a second channel stopper layer by introducing a second conductivity type impurity in the first channel stopper layer of a position farther from the second well region and/or the third well region; forming a LOCOS oxide film between the first well region and the fourth well region, between the first well region and the fifth well region, between the second well region and the sixth well region and between the third well region and the sixth well region; forming a gate insulating film on the first well region and on the sixth well region; after forming the LOCOS oxide film, forming a third channel stopper layer by introducing a first conductivity type impurity in the epitaxial layer except a direction facing the fourth well region and/or the fifth well region and the first well region; forming a fourth channel stopper layer by introducing a first conductivity type impurity in the third channel stopper layer of a position farther from the fourth well region and/or the fifth well region; forming a first conductivity type source region and drain region by introducing further a first conductivity type impurity in the second and third well regions and forming a second conductivity type source region and drain region by introducing further a second conductivity type impurity in the fourth and fifth well regions; forming electrodes connected to the source regions and drain regions respectively; and forming gate electrodes on the gate insulating films respectively.

Due to this, it is possible to simply produce in a high yield a semiconductor device that substantially prevents a high electric field from forming between the channel and parasitic channel stopper when in an operating state, preventing a change to the threshold voltage $V_{th}$, on-resistance $R_{on}$, or other characteristics of the semi-conductor device.

BRIEF DESCRIPTION OF THE DRAWINGS

These and other objects and features of the present invention will become clearer from the following description of the preferred embodiments given with reference to the accompanying drawings, in which:

FIG. 3 is a top view of a high withstand voltage PMOS transistor of the related art;

FIG. 6 is a top view of a high withstand voltage an NMOS transistor of the first embodiment of the present invention;

FIGS. 11A to 11F are cross-sectional views of a main production step of the method of producing a semiconductor device of the second embodiment of the present invention.

DESCRIPTION OF THE PREFERRED EMBODIMENTS

Below, preferred embodiments of the present invention will be described with reference to the accompanying drawings.

Note that the following description is made of just some embodiments of the present invention and that the type of substrate, type of impurity, structure of layers of the semiconductor device, etc. can be changed freely within a range that is in accordance with the present invention.

Figure 1:
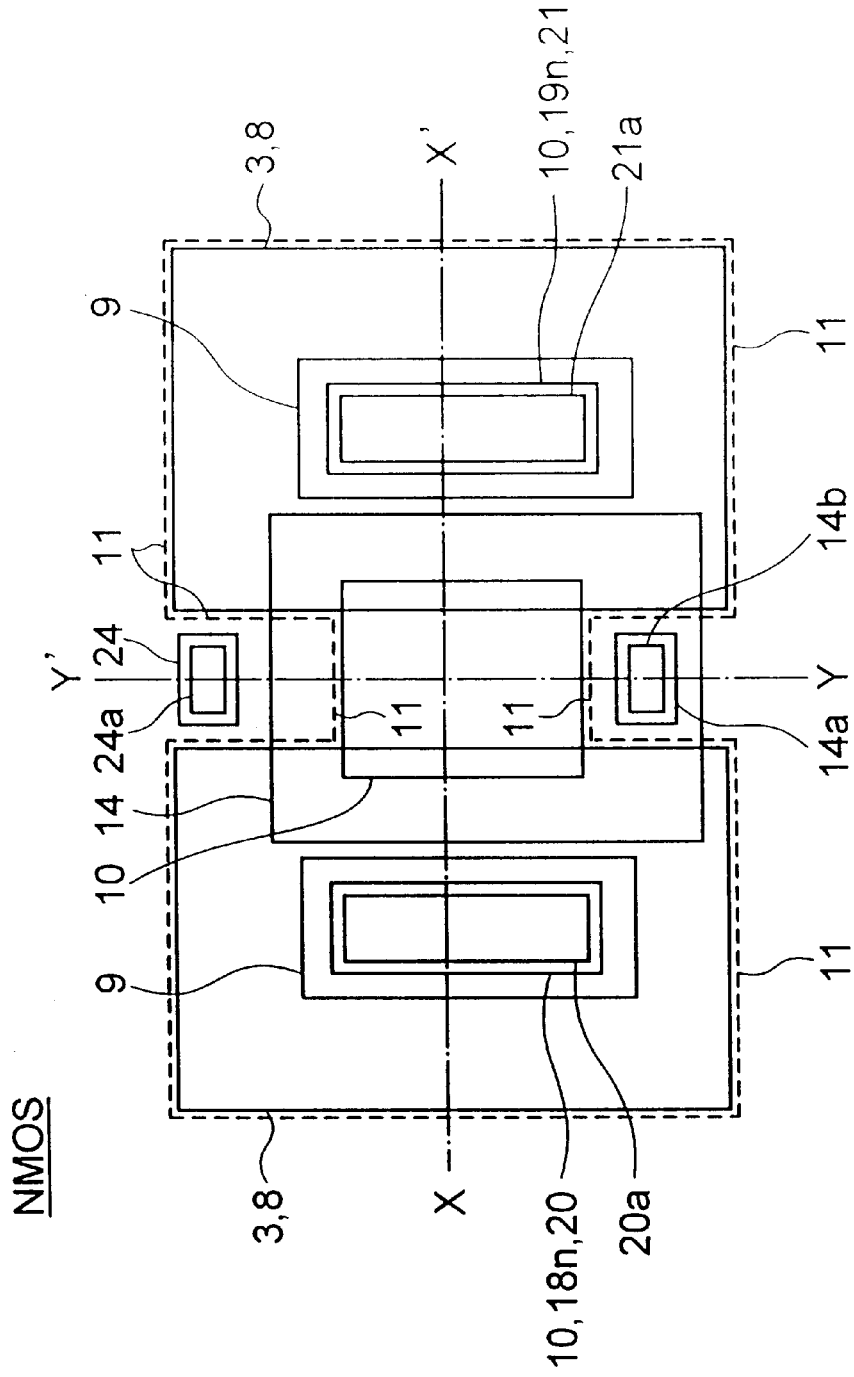
FIG. 1 is a top view of a high withstand voltage NMOS transistor of the related art.
Figure 2A:
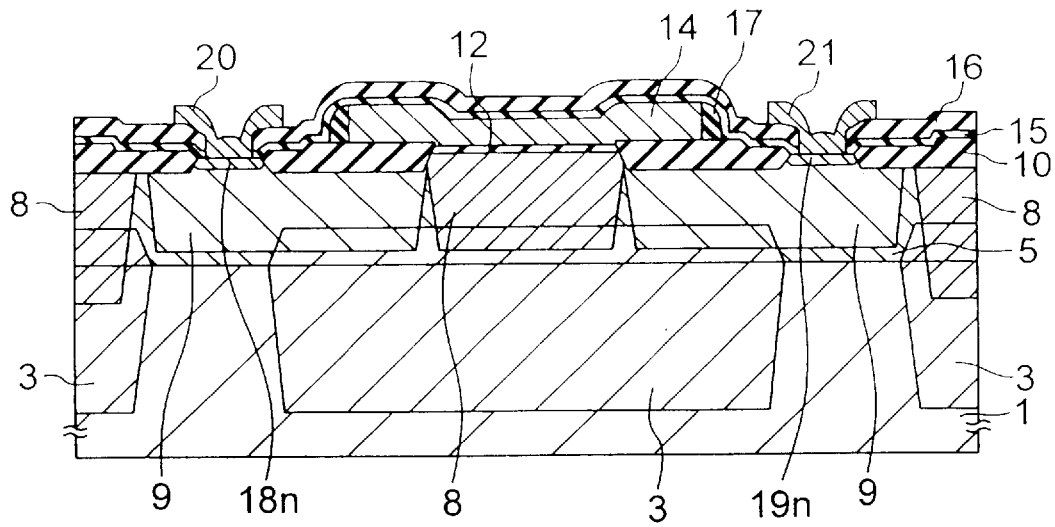
FIG. 2A is a cross-sectional view of FIG. 1 along X–X'.
Figure 2B:
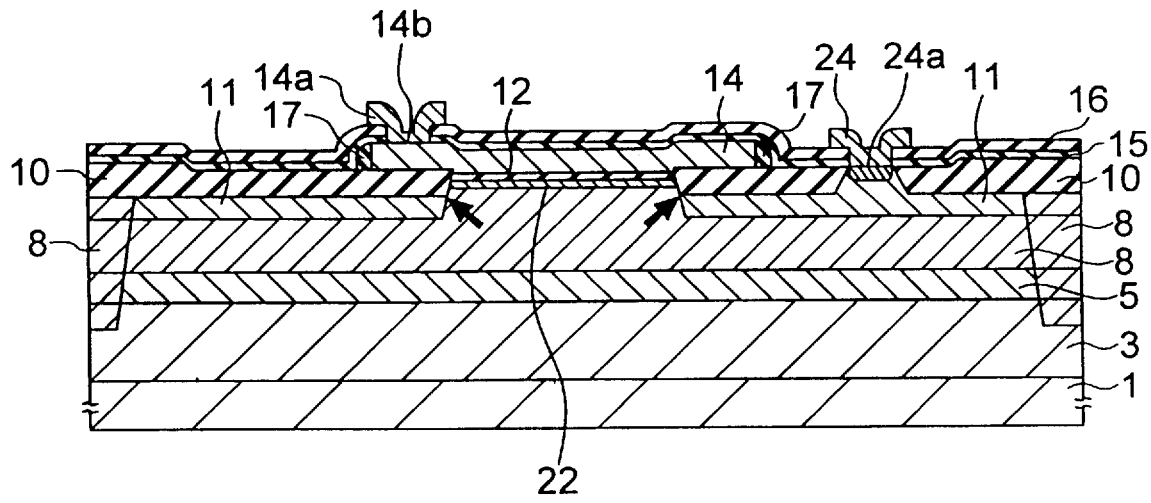
FIG. 2B is a cross-sectional view of FIG. 1 along Y–Y'.
Figure 4A:
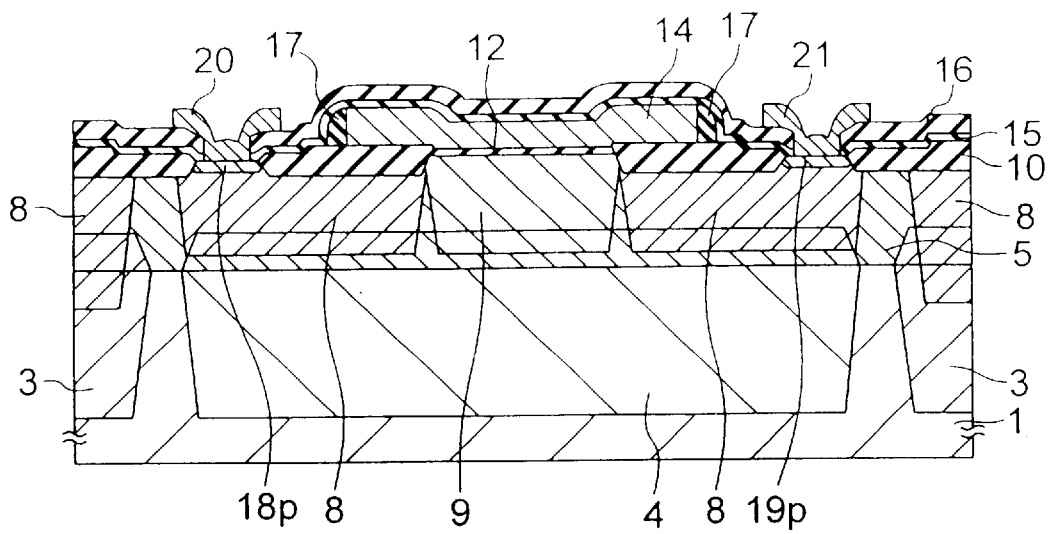
FIG. 4A is a cross-sectional view of FIG. 3 along X–X'.
Figure 4B:
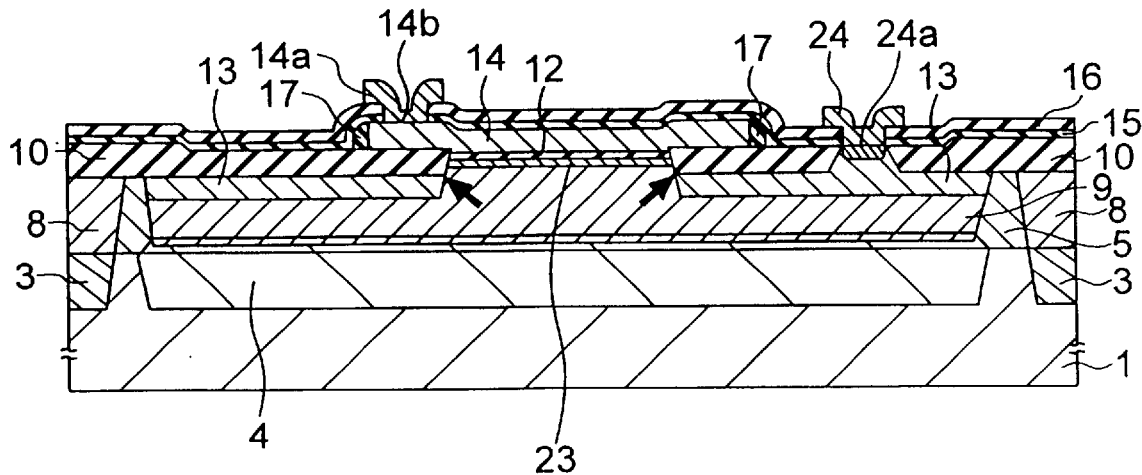
FIG. 4B is a cross-sectional view of FIG. 3 along Y–Y'.
Figure 5:
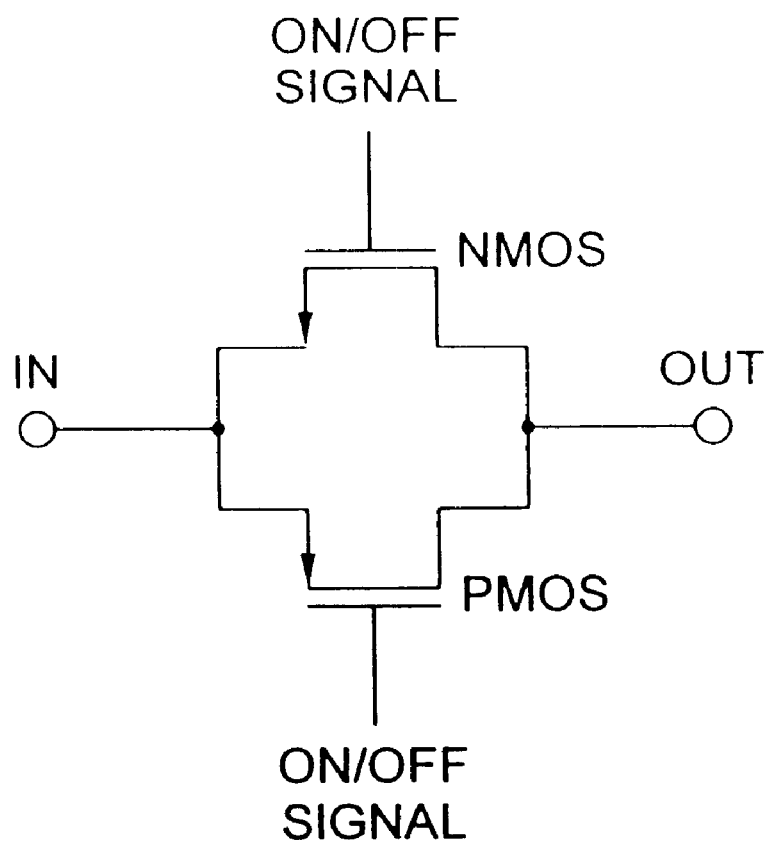
FIG. 5 is a circuit diagram of an analog switch configured by high withstand voltage MOS transistors of the related art.
Figure 7A:
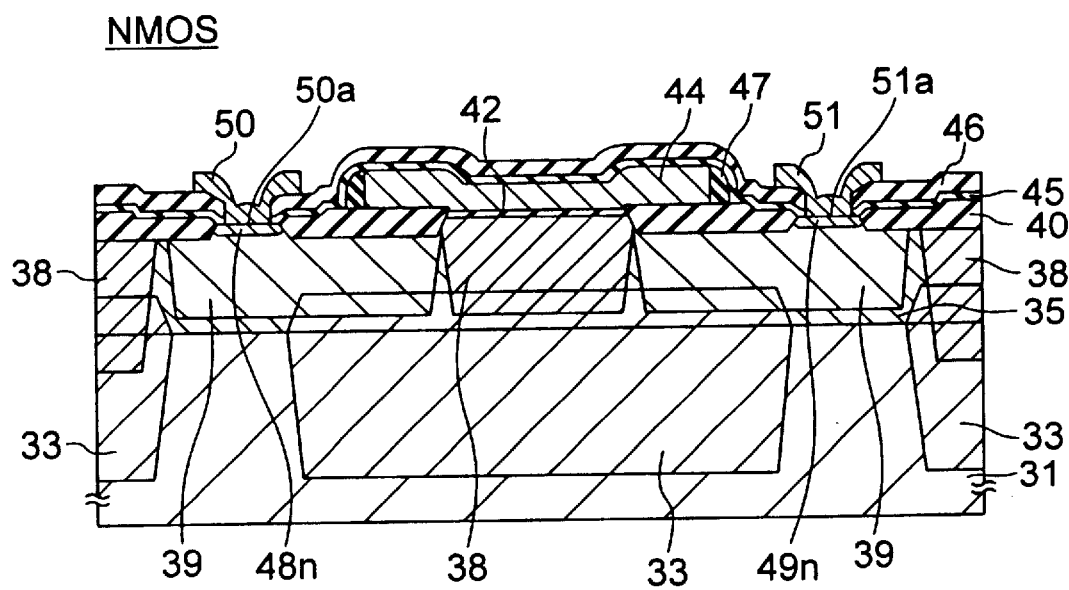
FIG. 7A is a cross-sectional view of FIG. 6 along X–X'.
Figure 7B:
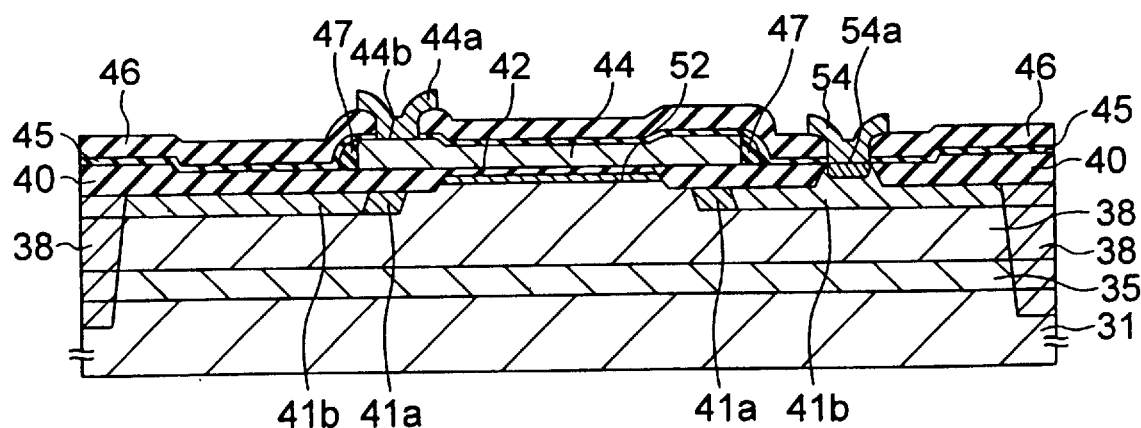
FIG. 7B is a cross-sectional view of FIG. 6 along Y–Y'.
Figure 8:
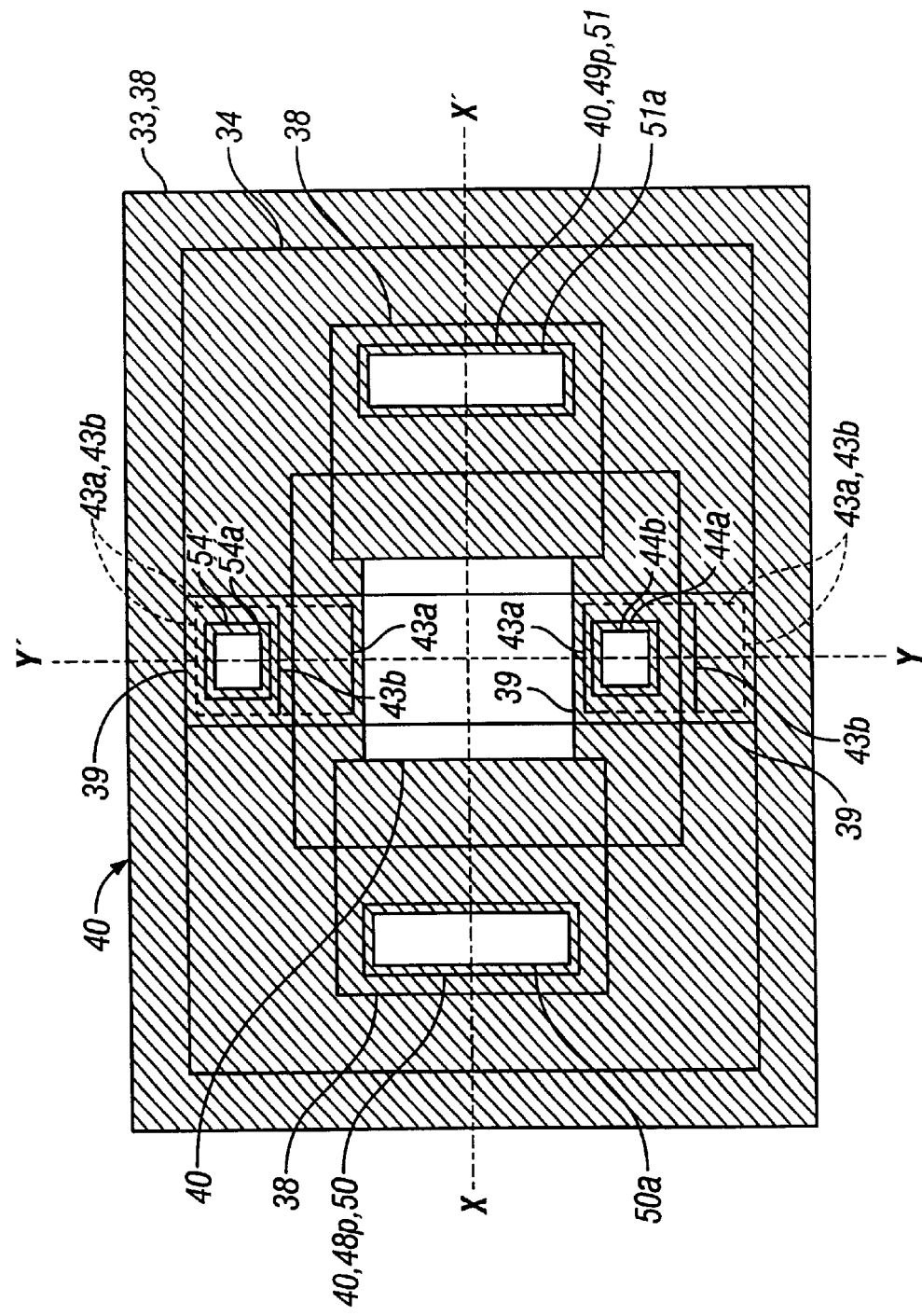
FIG. 8 is a top view of a high withstand voltage PMOS transistor of the first embodiment of the present invention.
Figure 9A:
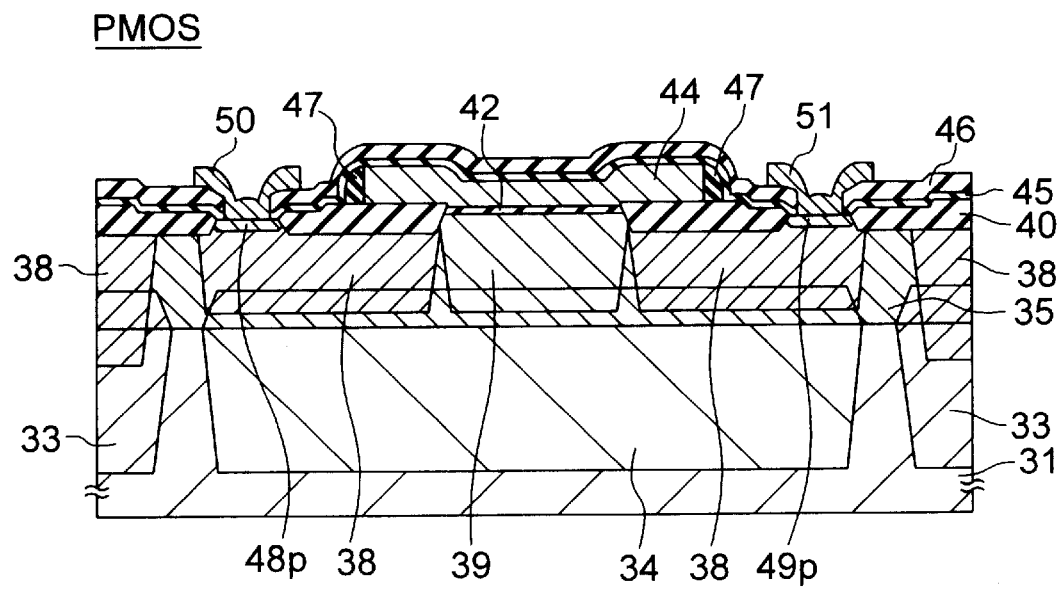
FIG. 9A is a cross-sectional view of FIG. 8 along X–X'.
Figure 9B:
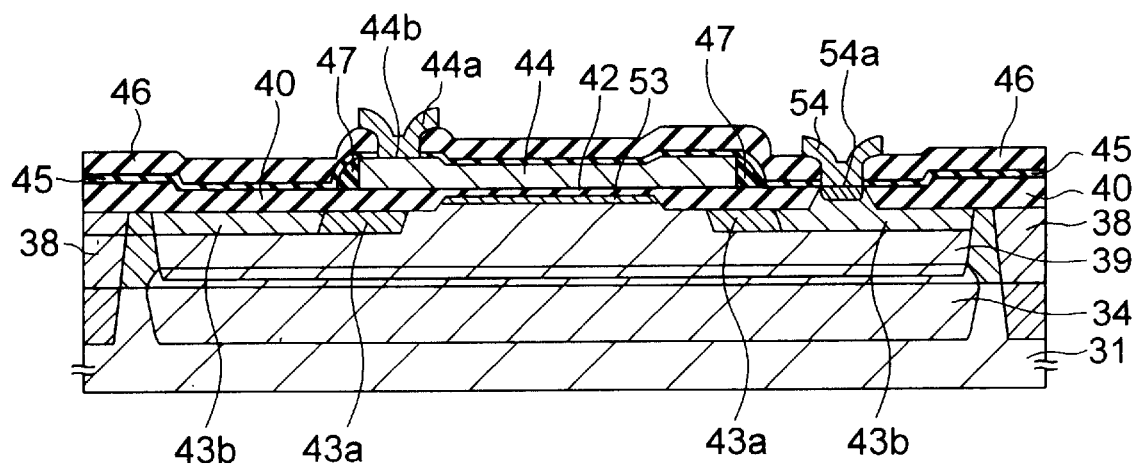
FIG. 9B is a cross-sectional view of FIG. 8 along Y–Y'.

FIG. 6 is a top view of a high withstand voltage NMOS transistor of embodying the present invention viewed from an upper side of the substrate, FIG. 7A is a cross-sectional view along X–X' of FIG. 6, and FIG. 7B is a cross-sectional view along Y–Y' of FIG. 6. Also, FIG. 8 is a top view of the high withstand voltage PMOS transistor of embodying the present invention viewed from an upper side of the substrate, FIG. 9A is a cross-sectional view along X–X' of FIG. 8, and FIG. 9B is a cross-sectional view along Y–Y' of FIG. 8. In the top views of FIG. 6 and FIG. 8, a broken line represents a part overlapped with a solid line.

These high withstand voltage MOS transistors are improved LOD/S (LOCOS offset drain/source)-type LDMOS transistors.

For example, the NMOS transistor shown in FIGS. 7A and 7B has a structure as follows. A buried layer doped with a p-type impurity (PBL) 33 is formed in a predetermined region of a p-type silicon semiconductor substrate 31, an n-type epitaxial layer 35 is formed on them, and a p-well 38 and n-well 39 are formed in a surface part. In this case, the p-well 38 becomes an active region and the n-well 39 becomes an offset source region and offset drain region.

Also, a gate electrode 44 is formed over a gate oxide film 42 that is formed over a region of the p-well 38 that is separated by a field insulating film (LOCOS oxide film depicted by reference number 40). As shown in the cross-sectional view of FIG. 7A, an n-type source region 48n and n-type drain region 49n are respectively formed on the surface of the n-well 39 of the offset source region or offset drain region.

The parasitic n-channel stopper layers 41a, 41b are formed at the junction of the p-well 38 and LOCOS 40 so as to sandwich an n-channel formation region 52 just below the polycrystalline silicon gate electrode 44 between them. The parasitic n-channel stopper layers 41a, 41b contain a p-type impurity. The concentration of the p-type impurity becomes smaller at the parasitic n-channel stopper layer 41a approaches the n-channel formation region 52.

Further, as shown in FIGS. 7A and 7B, silicon oxide films 45, 46 covering the upper side are formed in the above transistor.

Also, as shown in FIG. 7B, on the p-well 38, a backgate electrode 54 is formed via the parasitic n-channel stopper layer 41b. In a backgate contact 54a part, a low resistivity region (backgate plug region) in which a p-type impurity is diffused is formed.

On the other hand, the PMOS transistor shown in FIGS. 9A and 9B has a similar structure. Parasitic p-channel stopper layers 43a, 43b are formed just below the LOCOS oxide film 40 at the edge of the polycrystalline silicon gate electrode 44 so as to sandwich the p-channel formation region 53 between them. The parasitic p-channel stopper layers 43a, 43b contain an n-type impurity. The concentration of the n-type impurity becomes smaller at the parasitic p-channel stopper layer 43a approaching the p-channel formation region 53.

The semiconductor device of the present invention is a high withstand voltage MOS transistor having an offset drain/offset source structure wherein the parasitic channel stopper layers 41a, 41b or 43a, 43b are formed to have a concentration gradient where their impurity concentrations decrease in the direction of the channel formation regions 52, 53. Due to this, it is possible to ease or substantially prevent a high electric field from being generated between the channel and parasitic channel stopper layer in an operating state.

Therefore, according to the semiconductor device of the present invention, it is possible to reliably prevent changes to the threshold voltage $V_{th}$, on-resistance $R_{on}$, and other characteristics.

Also, the semiconductor device of the present invention may realize a higher withstand voltage by employing the RESURF technique in the same manner as the conventional transistor.

Further, since the semiconductor device of the present invention, unlike the general LOD-type LDMOS transistors, has a symmetrical structure right and left from the gate, that is, in the direction of the source and the drain, it is possible to increase the withstand voltage not only between a backgate and the drain and between the gate and the drain or other drain sides but also between a backgate and the source and between the gate and source or other source sides.

Figure 10:
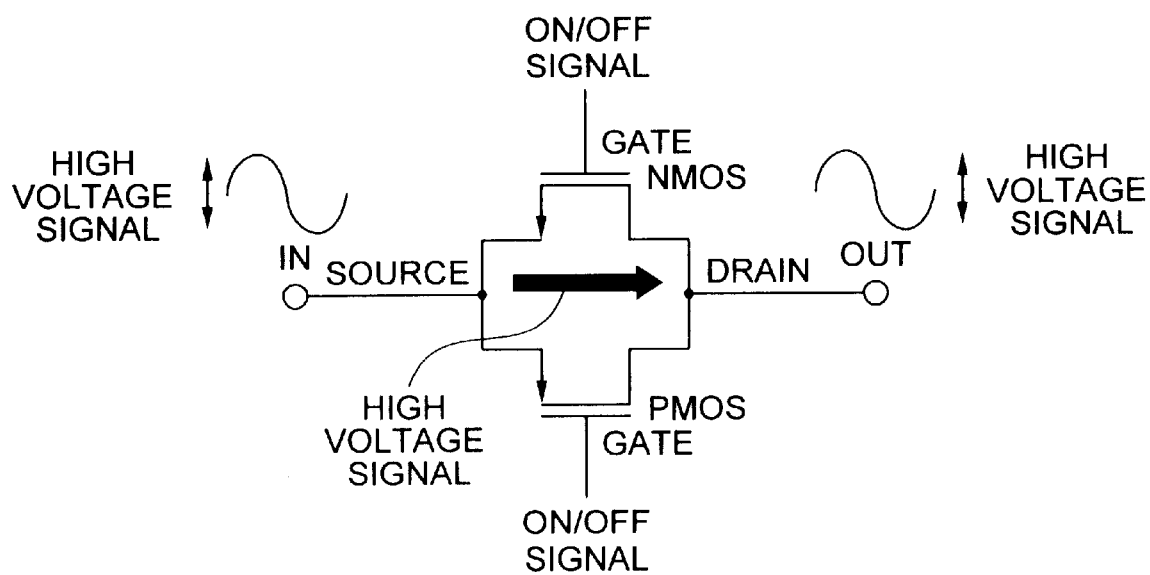
FIG. 10 is a circuit diagram of an analog switch using the semiconductor device of the present invention.

The semiconductor device of the present invention is substantially free from changes to the threshold voltage $V_{th}$, on-resistance $R_{on}$, or other characteristics when forming, for example, an analog switch as shown in FIG. 10. Therefore, the semiconductor device of the present invention allows the transfer of an input signal precisely to an output circuit without substantially restricting the voltage of the input or the output signal.

FIGS. 11A to 11F depict a method of producing a semiconductor device of the present invention. Below, the method will be explained with reference to FIGS. 11A to 11F.

First, a silicon oxide film 32 having a thickness of about 60 to 100 nm is formed on a p-type silicon semiconductor substrate 31 by steam-oxidation at about 900 to 1000° C. Next, existing photolithography technology and ion-implantation technology are used together with a resist mask (not shown) for ion implantation of boron of a dose of about $1 \times 10^{13}$ to $1 \times 10^{14}/cm^2$ for the purpose of forming a p-type buried layer 33 in an element isolation region and active region of the NMOS transistor.

Next, the resist mask is removed and existing photolithography technology and ionimplantation technology are used again together with a second resist mask (not shown) for ion implantation of phosphorus of a dose of about $5 \times 10^{12}$ to $5 \times 10^{13}/cm^2$ to form an n-type buried layer 34 in the active region of the PMOS transistor.

Further, the second resist mask is removed, then heat treatment is performed at about 1100 to 1200° C. to form the p-type buried layer 33 and n-type buried layer 34. As explained above, the structure shown in FIG. 11A is obtained.

Next, existing epitaxial formation technology is used to form an n-type epitaxial layer 35 having a resistivity of about 5 to 10 Ω-cm. The thickness of the n-type epitaxial layer 35 is determined in accordance with the desired withstand voltage, but is generally calculated using as a standard about 10 ?m per 100 V.

Next, a silicon oxide film 36 of 60 to 100 nm is formed on the surface of the n-type epitaxial layer 35 by steam-oxidation at about 900 to 1000° C. As described above, a structure shown in FIG. 11B is obtained.

Next, existing photolithography technology and ion-implantation technology are used together with a third resist mask (not shown) for ion implantation of boron of about $1 \times 10^{13}$ to $1 \times 10^{14}/cm2$ for the purpose of forming the p-well 38 in the element isolation region, the active region of the NMOS transistor, and the offset drain/offset source formation region of the PMOS transistor.

The third resist mask is removed, then existing photolithography technology and ionimplantation technology are again used together with a fourth resist mask (not shown) for ion implantation of phosphorus of about $5 \times 10^{12}$ to $1 \times 10^{13}/cm^2$ for the purpose of forming the n-well 39 in the offset drain/offset source formation region of the NMOS transistor and the active region of the PMOS transistor.

Next, the fourth resist mask is removed, then a silicon nitride ($Si_3N_4$) film 37 having a thickness of about 80 to 100 nm is formed by low pressure CVD (chemical vapor deposition). Further, the p-well 38 and n-well 39 are formed by heat treatment at about 1100 to 1200° C.

Figure 11C:
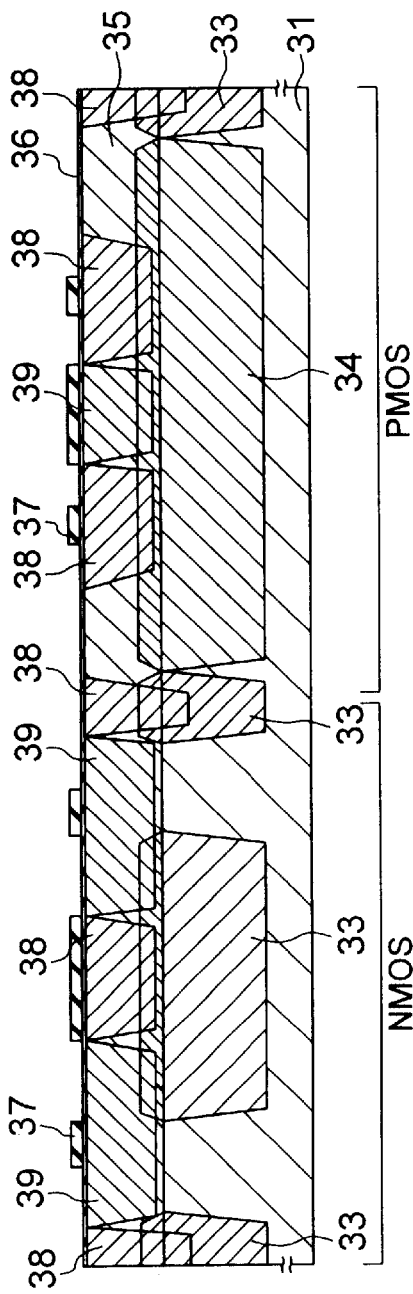

Next, for the purpose of forming the active region, photolithography technology and RE (reactive ion etching) or another existing etching technology are used for etching so as to leave the $Si_3N_4$ film 37 covering the active region. By doing this, the structure shown in FIG. 11C is obtained.

Further, photolithography technology and ion-implantation technology are used for ion implantation of phosphorus of a dose of about $1 \times 10^{12}$ to $1 \times 10^{13}/cm^2$ in a parasitic p-channel stopper layer formation region (region corresponding to the parasitic p-channel stopper layers 43a, 43b of FIG. 8 and FIG. 9B) of the PMOS transistor.

Next, photolithography technology and ion-implantation technology are used together with a fifth resist mask (not shown) for ion implantation of phosphorus of a dose of about $1 \times 10^{13}$ to $1 \times 10^{14}/cm^2$ in a part of the parasitic p-channel stopper formation region of the PMOS transistor except a part near the p-channel formation region 53 (region corresponding to the parasitic p-channel stopper layer 43b of FIG. 9B).

Further, the fifth resist mask is removed and steam-oxidation is performed at about 950 to 1000° C. to form a LOCOS oxidation film 40 having a thickness of about 500 to 700 nm.

Figure 11D:
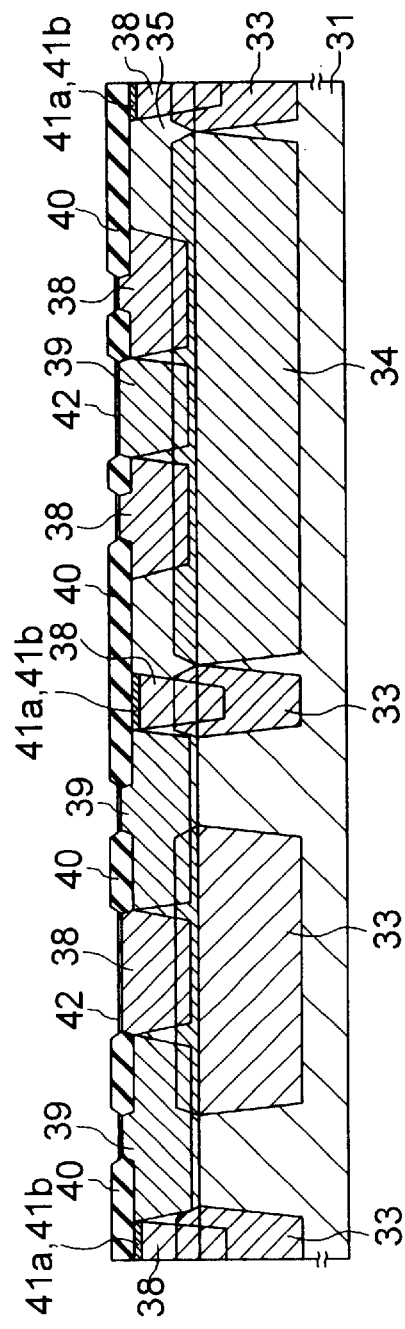
Figure 11E:
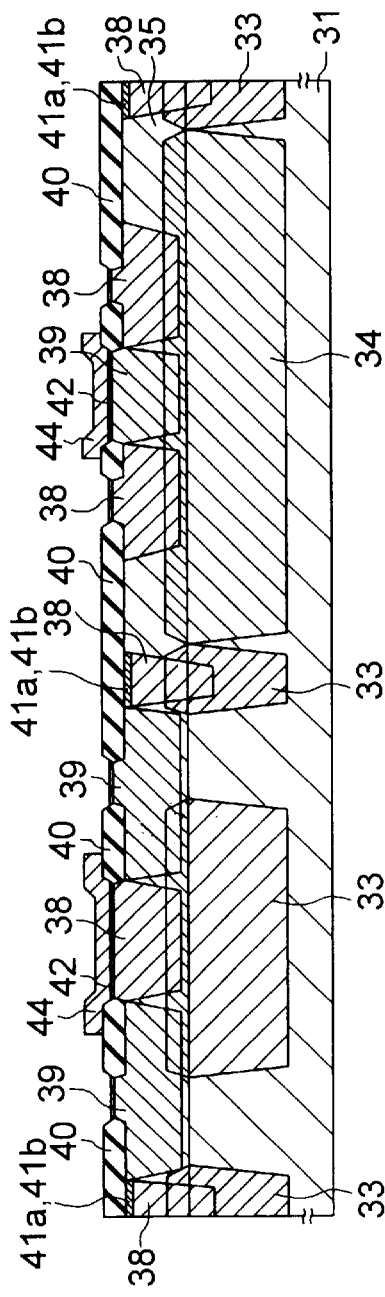

Though not shown in FIG. 11D, a parasitic p-channel stopper layer having a concentration gradient is formed at the same time. This parasitic p-channel stopper layer, as shown in FIG. 8 and FIG. 9B (see the parasitic p-channel stopper layers 43a, 43b), is formed at the two edges of the channel formation region 53 in the direction of a gate width of the channel formation region 53 just below the LOCOS oxide film 40.

In this way, by making the impurity profile of the parasitic p-channel stopper layer (i.e., 43a and 43b) less in concentration as the parasitic p-channel stopper layer approaches the p-channel formation region 53, the semi conductor device that is formed eases or substantially prevents a high electric field from being generated between the p-channel 53 and parasitic p-channel stopper layers 43a, 43b, and thus, prevents changes to the threshold voltage $V_{th}$, on-resistance $R_{on}$, or other characteristics.

Next, the silicon nitride film 37 is removed with hot phosphoric acid and the silicon oxide film 36 at the surface of the n-type epitaxial layer 35 is removed using a hydrofluoric acid (HF) solution.

Next, the gate oxide film 42 of about 100 to 200 nm is formed by steam-oxidation at about 950 to 1000° C. (see FIG. 11D).

Further, photolithography technology and ion-implantation technology are used together with a sixth resist mask (not shown) for ion implantation of boron of about $5 \times 10^{12}$ to $5 \times 10^{13}/cm^2$ in the parasitic n-channel stopper layers 41a, 41b formation region in the element isolation region and NMOS transistor. By ion-implanting boron after forming the LOCOS oxide film in this way, it is possible to prevent a decrease of concentration of the impurity in the n-channel stopper layer 41a, 41b at the surface of the substrate.

Next, photolithography technology and ion-implantation technology are used for ion implantation of boron of about $5 \times 10^{13}$ to $5 \times 10^{14}/cm^2$ in the parasitic n-channel stopper layer 41b formation region (region away from the n-channel formation region 52 in the parasitic n-channel stopper layer 41a, 41b) in the element isolation region and NMOS transistor.

Next, the CVD process is used to deposit an n$^+$-type polycrystalline silicon film containing an n-type impurity of about 400 nm. Next, photolithography technology and RIE or another existing etching technology are used for etching to leave the n$^+$-polycrystalline silicon only on the gate formation region of the MOS transistor to form the polycrystalline silicon gate electrode 44 (see FIG. 11E). Further, photolithography technology and existing etching technology are used to remove the gate oxide film 42 on the source/drain formation region (i.e. region 38 left and right of gate electrode 44 for PMOS transistor in FIG. 11E and region 39 left and right of input of gate electrode 44 for NMOS transistor in FIG. 11E). Further, a oxide film (not shown) of about 10 to 20 nm (corresponding to the silicon oxide film 45 in FIG. 7 and FIG. 9) is formed by steam-oxidation at about 800 to 900° C.

Next, existing photolithography technology and ion-implantation technology are used together with a seventh resist mask (not shown) for ion implantation of boron of about $1 \times 10^{15}$ to $1 \times 10^{16}/cm^2$ in the p$^+$-source/drain formation region of the PMOS transistor and a backgate plug region of the NMOS transistor.

Further, the seventh resist mask is removed, then photolithography technology and ionimplantation technology are used with a eighth resist mask (not shown) for ion implantation of As of about $1 \times 10^{15}$ to $1 \times 10^{16}/cm^2$ in the source/drain region of the NMOS transistor and a backgate plug region of the PMOS transistor.

Next, the eighth resist mask is removed, then a silicon oxide film 46 having a thickness of about 600 nm is formed by the CVD process and heat treatment is performed at about 850 to 950° C. Due to this, the ion-implanted impurity diffuses and the p-type source region 48p and p-type drain region 49p of the PMOS transistor, the not shown backgate plug region of the NMOS transistor, and the n-type source region 48n and n-type drain region 49n of the NMOS transistor and the not shown backgate plug region of the PMOS transistor are formed.

At the same time as this, the parasitic n-channel stopper layers 41a, 41b of the NMOS transistor are formed. In the same manner as the parasitic p-channel stopper layer described above, the impurity profile of the parasitic n-channel stopper layers 41a, 41b is made less in concentration as the parasitic n-channel stopper layer 41a, 41b approaches the n-channel formation region 52, so it is made possible to ease or substantially prevent a high electric field from being generated between the n-channel 52 and parasitic n-channel stopper layers 41a, 41b, and thus, prevent changes to the threshold voltage $V_{th}$, on-resistance $R_{on}$, or other characteristics.

Next, photolithography technology and RIE or another existing etching technology are used together with a not shown resist mask to open electrode windows in regions for forming the source electrode 50, drain electrode 51, gate electrode plug 44a, etc. in the silicon oxide film 46. After a metal electrode containing Al or Ti/TiON/Ti/Al—Si or other barrier metal is vapor deposited in the electrode windows, it is patterned by photolithography technology and RIE technology, then the source electrode 50, drain electrode 51, gate electrode plug 44a, and backgate electrode (not shown) are formed in the NMOS and PMOS.

Figure 11F:
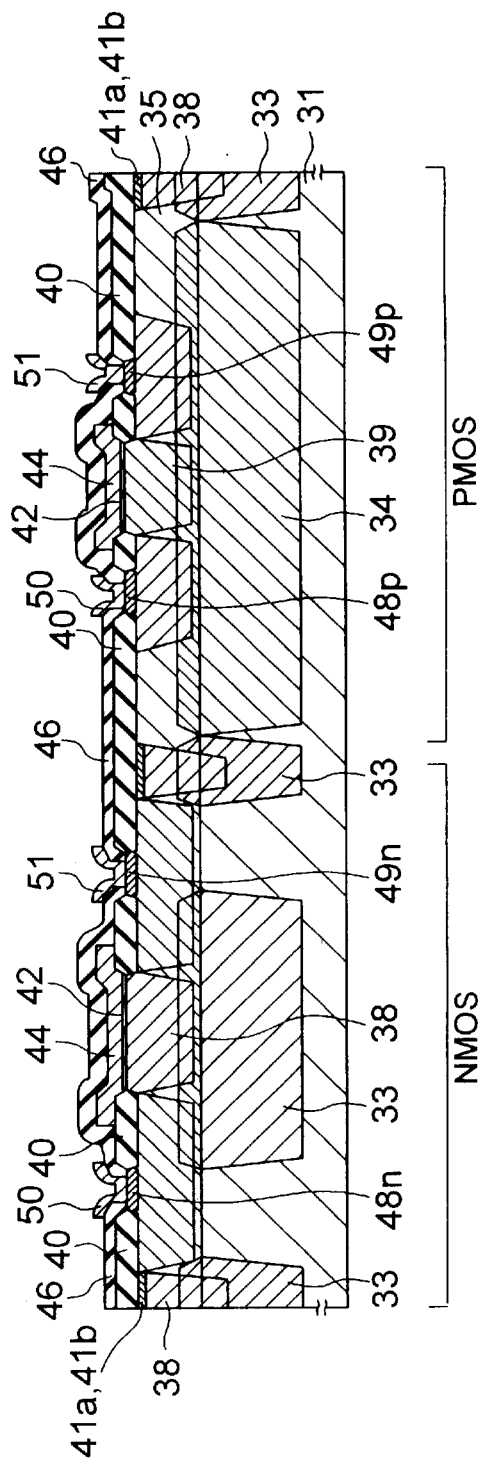

As described above, it is possible to produce a semiconductor device shown in FIG. 11F.

According to the present invention, it is possible to produce in a high yield a CMOS transistor of a structure having a concentration gradient where the concentration of impurity in the parasitic channel stopper layer decreases in a direction approaching the channel of the CMOS transistor.

As explained above, according to the semiconductor device of the present invention, by forming the parasitic channel stopper layer with a concentration gradient where the concentration of impurity in the parasitic channel stopper layer decreases in a direction approaching the channel region, it is possible to ease or substantially prevent the high electric field from being generated between the channel and parasitic channel stopper in an operating state so as to prevent changes to the threshold voltage $V_{th}$, on-resistance $R_{on}$, or other characteristics.

Also, when forming an analog switch configured by high withstand voltage NMOS and PMOS transistors using the structure of the present invention, since there are no changes in the threshold voltage $V_{th}$, on-resistance $R_{on}$, or other characteristics, it is made possible to transfer an input signal to an output circuit without substantially restricting voltage of the input signal.

Further, according to the method of producing a semiconductor device of the present invention, it is possible to produce a semiconductor device of the present invention in a high yield.

While the invention has been described with reference to specific embodiments chosen for purpose of illustration, it should be apparent that numerous modifications could be made thereto by those skilled in the art without departing from the basic concept and scope of the invention.

What is claimed is:

1. A semiconductor device comprising:

a substrate;

an epitaxial layer formed on the substrate;

a source region and a drain region formed in the epitaxial layer and containing a first conductivity type impurity;

a source electrode connected to the source region;

a drain electrode connected to the drain region;

a channel region formed between the source region and drain region;

a gate insulating film formed on the channel region;

a gate electrode formed on the gate insulating film; and at least a second conductivity type channel stopper layer formed in the epitaxial layer in proximity to and without abutting the channel region and except between the source region and drain region, and wherein an impurity concentration in a first region of the channel stopper layer near the channel region is lower than an impurity concentration in a second region far from the channel region.

2. A semiconductor device as set forth in claim 1, further comprising a field insulating film formed on the channel stopper layer to extend beyond the channel stopper layer in the direction of the channel region.

3. A semiconductor device as set forth in claim 2, wherein the field insulating film is formed to abut the channel region.

4. A semiconductor device as set forth in claim 2, wherein said field insulating film is formed on a surface of the epitaxial layer between the source electrode and/or the drain electrode and the gate electrode.

5. A semiconductor device as set forth in claim 4, wherein the field insulating film comprises an oxide film.

6. A semiconductor device comprising:

a first conductivity type substrate;

a second conductivity type epitaxial layer formed on the substrate;

a first well region and a second well region formed in the epitaxial layer and containing a second conductivity type impurity;

a source region formed in the first well region and containing a second conductivity type impurity at a higher concentration than the first well region;

a drain region formed in the second well region and containing a second conductivity type impurity at a higher concentration than the second well region;

a source electrode connected to the source region;

a drain electrode connected to the drain region;

a channel region formed between the source region and the drain region;

a gate insulating film formed on the channel region; and a gate electrode formed on the gate insulating film, wherein the channel region is included in at least a first conductivity type third well, said device comprising at least a first conductivity type channel stopper layer formed in the epitaxial layer in proximity to and without abutting the channel region and except between the source region and the drain region, and wherein an impurity concentration in a first region of the channel stopper layer near the channel region is lower than an impurity concentration in a second region far from the channel region.

7. A semiconductor device as set forth in claim 6, further comprising a field insulating film formed on the channel stopper layer to extend beyond the channel stopper layer in the direction of the channel region.

8. A semiconductor device as set forth in claim 7, wherein the field insulating film is formed to abut the channel region.

9. A semiconductor device as set forth in claim 7, wherein the field insulating film is formed on a surface of the epitaxial layer between the source electrode and/or the drain electrode and the gate electrode.

10. A semiconductor device as set forth in claim 9, wherein the field insulating film comprises an oxide film.

11. A semiconductor device comprising:

a first conductivity type substrate;

a second conductivity type buried layer formed in the substrate;

a second conductivity type epitaxial layer formed on the substrate;

a first well region and a second well region formed in the epitaxial layer and containing a first conductivity type impurity;

a source region formed in the first well region and containing a first conductivity type impurity at a higher concentration than the first well region;

a drain region formed in the second well region and containing a first conductivity type impurity at a higher concentration than the second well region;

a source electrode connected to the source region;

a drain electrode connected to the drain region;

a channel region formed between the source region and the drain region;

a gate insulating film formed on the channel region; and a gate electrode formed on the gate insulating film, wherein the channel region is included in at least a second conductivity type third well, said device comprising at least a second conductivity type channel stopper layer formed in the epitaxial layer in proximity to and without abutting the channel region and except between the source region and the drain region, and wherein an impurity concentration in a first region of the channel stopper layer near the channel region is lower than an impurity concentration in a second region far from the channel region.

12. A semiconductor device as set forth in claim 11, further comprising a field insulating film formed on the channel stopper layer to extend beyond the channel stopper layer in the direction of the channel region.

13. A semiconductor device as set forth in claim 12, wherein the field insulating film is formed to abut the channel region.

14. A semiconductor device as set forth in claim 12, wherein the field insulating film formed on a surface of the epitaxial layer between the source electrode and/or the drain electrode and the gate electrode.

15. A semiconductor device as set forth in claim 14, wherein the field insulating film comprises an oxide film.

* * * * *